United States Patent
Bruce et al.

(10) Patent No.: US 6,395,624 B1
(45) Date of Patent: May 28, 2002

(54) METHOD FOR FORMING IMPLANTS IN SEMICONDUCTOR FABRICATION

(75) Inventors: James A. Bruce, Williston; Randy W. Mann, Jericho, both of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/253,952

(22) Filed: Feb. 22, 1999

(51) Int. Cl.[7] .................. H01L 21/336; H01L 21/26; H01L 21/31; H01L 21/469; H01L 21/324; H01L 21/42

(52) U.S. Cl. .................. 438/535; 438/305; 438/308; 438/763; 438/795; 438/952

(58) Field of Search .................. 438/305, 308, 438/952, 535, 763, 795

(56) References Cited

U.S. PATENT DOCUMENTS

| | | |
|---|---|---|
| 4,343,832 A | 8/1982 | Smith et al. |
| 5,114,876 A | 5/1992 | Weiner |
| 5,126,165 A | 6/1992 | Akihama et al. |
| 5,130,263 A | 7/1992 | Possin et al. |
| 5,316,969 A | 5/1994 | Ishida et al. |
| 5,386,798 A | 2/1995 | Lowndes et al. |
| 5,604,138 A * | 2/1997 | Lee et al. |
| 5,612,235 A | 3/1997 | Wu et al. |
| 5,696,011 A | 12/1997 | Yamazaki et al. |
| 5,817,550 A * | 10/1998 | Carey et al. |
| 5,908,307 A * | 6/1999 | Talwar et al. |
| 5,955,759 A * | 9/1999 | Ismail et al. |
| 5,962,195 A * | 10/1999 | Yen et al. |

OTHER PUBLICATIONS

Kurt H. Weiner and Somit Talwar, "Self Aligned Silicide Formation Using Gas Immersion Laser Annealing (GILA)", An Ultratech Stepper technical brief, Mar. 3, 1997.

Kurt H. Weiner and Somit Talwar, "Ultrashallow Junction Formation Using Projection Gas Immersion Laser Doping (PGID)", A Verdant Technologies technical brief, Aug. 20, 1997.

* cited by examiner

*Primary Examiner*—John F. Niebling
*Assistant Examiner*—Ron Pompey
(74) *Attorney, Agent, or Firm*—Schmeiser, Olsen & Watts

(57) ABSTRACT

The present invention provides a novel method of forming implants with Projection Gas-Immersion Laser Doping (PGILD) process that overcomes the disadvantages of the prior art methods. In particular, the preferred method applies a reflective coating over features before the application of the PGILD laser. The reflective coating lowers the amount of heat absorbed by the features, improving the reliability of the fabrication process. The preferred method is particularly applicable to the fabrication of field effect transistors (FETs). In this application, a gate stack is formed, and a reflective coating is over the gate stack. An anti-reflective coating (ARC) is then applied over the reflective coating. The anti-reflective coating reduces variability of the photolithographic process used to pattern the gate stack. After the gate stack is patterned, the anti-reflective coating is removed, leaving the reflective coating on the gate stack. The PGILD process can then be used to form source/drain doped regions on the transistors. The reflective coating reduces the amount of heat absorbed by the gate stack, and thus provides an improved method for fabricating transistors.

18 Claims, 5 Drawing Sheets

METHOD FOR FORMING IMPLANTS IN SEMICONDUCTOR FABRICATION

BACKGROUND OF THE INVENTION

1. Technical Field

The present invention relates generally to the field of semiconductor manufacturing and, more specifically, to a method for forming semiconductor devices using Projection Gas-Immersion Laser Doping.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

One new method that shows promise in reducing the cost and complexity of manufacturing integrated circuits is the use of Projection Gas-Immersion Laser Doping (PGILD) developed at Lawrence Livermore National Laboratory. The PGILD process reduces the need for normal photoresist processing during impurity doping. This allows for the elimination of multiple process steps and the associated equipment.

In particular, the PGILD process allows dopants to be selectively incorporated into a substrate without photoresist masking. PGILD uses a high-intensity, excimer laser beam for selectively exposing a wafer in an ambient containing the dopant atoms in gas phase above the wafer. The selective exposure exposes those portions of the wafer where impurities are desired. In the exposed portions of the wafer, light is absorbed by the silicon, heating the surface and allowing the dopant atoms to diffuse into the exposed portions of the wafer.

The PGILD process offers many advantages over conventional processing. First, because photoresist masking is not required, process complexity is significantly reduced. Second, the PGILD process can be used to form relatively abrupt p-n junctions of varying depth because of the higher liquid phase diffusion resulting from the PGILD process when compared to normal solid phase diffusion used in conventional processes. Third, the dopant atoms incorporated directly into the substrate are electrically active without requiring the additional anneals required by conventional processes. This, coupled with the relatively low energy required by the PGILD laser makes it a relatively low temperature technique, reducing the impact on the thermal budget when compared to conventional doping techniques.

The push for ever increasing device densities is particularly strong in CMOS technologies, such as the in the design and fabrication of field effect transistors (FETs). FETs are used in almost all types of integrated circuit design (i.e., microprocessors, memory, etc.)

The PGILD process has been proposed as method to improve the fabrication of FETs. In particular, the PGILD processes has been a proposed solution to provide the source/drain doped regions for FETs. One disadvantage to this proposed usage of the PGILD process is the amount of heat absorbed by the transistor and the difficulty in dissipating this heat. In particular, the laser used in the PGILD process heats the gate stack. This gate stack, typically made from a conductor such as polysilicon, absorbs heat from the laser and dissipates the heat into the underlying substrate. If the gate stack is unable to effectively dissipate the absorbed heat it can experience significant degradation and loss of continuity.

Typically, the problems with excessive heat absorption and insufficient heat dissipation are localized over areas where thicker oxide between the gate stack and the underlying substrate exists. For example, in modern FET devices shallow trench isolation (STI) is formed over non active areas of the chip. Thus, while sufficient heat dissipation can occur at areas of the gate stack over gate oxide, effective heat dissipation is prevented at areas of the gate stack over the STI. This heat absorption can then cause the gate stack to deform, resulting in morphological degradation due to temperatures near the melting point of silicon. These problems caused by the heat absorption have prevented the widespread adoption of the PGILD process, and thus prevents its other benefits from being available.

Thus, there is a need for improved methods of FET fabrication that allows new doping technologies such as PGILD to be effectively incorporated and used.

DISCLOSURE OF INVENTION

Accordingly, the present invention provides a novel method of forming semiconductor devices that utilizes Projection Gas-Immersion Laser Doping (PGILD) process that overcomes the disadvantages of the prior art methods. In particular, the preferred method applies a reflective coating over features before the application of the PGILD laser. The reflective coating lowers the amount of heat absorbed by the features, improving the reliability of the fabrication process.

The preferred method is particularly applicable to the fabrication of field effect transistors (FETs). In this application, a gate stack is formed, and a reflective coating is over the gate stack. An anti-reflective coating (ARC) is then applied over the reflective coating. The anti-reflective coating reduces variability of the photolithographic process used to pattern the gate stack. After the gate stack is patterned, the anti-reflective coating is removed, leaving the reflective coating on the gate stack. The PGILD process can then be used to form source/drain doped regions on the transistors. The reflective coating reduces the amount of heat absorbed by the gate stack, and thus provides an improved method for fabricating transistors.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

The present invention provides a novel method of forming semiconductor devices using the Projection Gas-Immersion Laser Doping (PGILD) process that overcomes the disadvantages of the prior art methods. In particular, the preferred method applies a reflective coating over the features, such as gate stacks or any other portion of a substrate, that it is undesirable to heat during the application of the PGILD laser. The reflective coating lowers the amount of heat absorbed by the feature, improving the reliability of the fabrication process.

Figure 1:
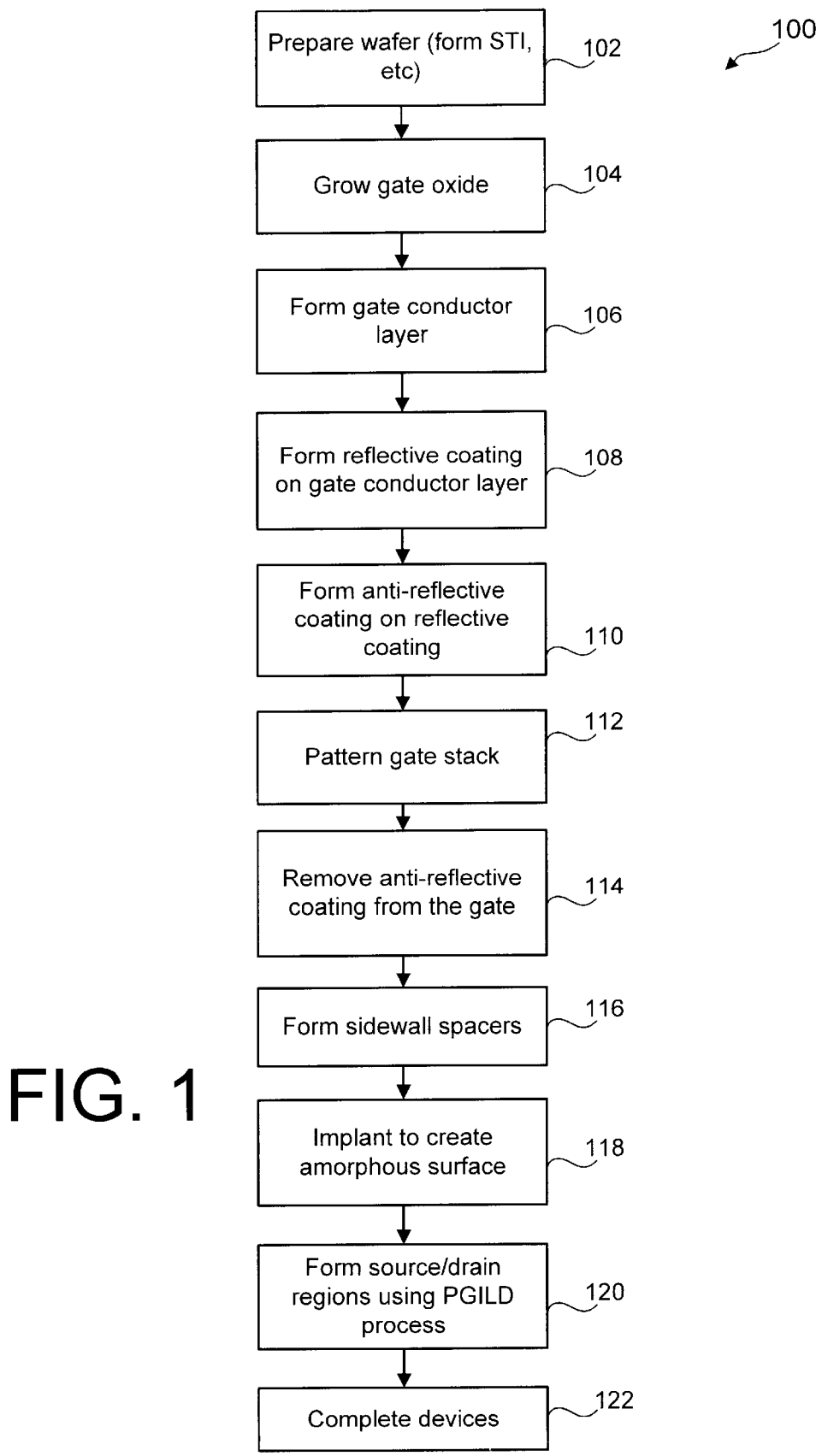
FIG. 1 is a flow diagram illustrating a method in accordance with the preferred embodiment.

Turning now to FIG. 1, a method 100 for forming a device using the preferred embodiment of the present invention, is illustrated. Method 100 uses the preferred embodiment to prevent damage to a gate stack structure in the formation of field effect transistor using the PGILD process. Those skilled in the art will recognize that the preferred embodiment can be used in the fabrication of other devices. For example, resistors, bipolar transistors and interconnect structures could be formed using the preferred embodiment methods.

The first step 102 of method 100 is to prepare the wafer for the fabrication of the field effect transistor. This would typically include the formation of isolation, such as shallow trench isolation (STI); implanting wells; etc.

The next step 104 is to grow gate oxide using any suitable method. Of course, other suitable dielectric materials can be used. After the gate oxide is formed, the next step 106 is to form gate conductor material. This typically involves the deposition of one or more layers of conductive material. For example, doped polysilicon is a commonly used gate conductor material. The polysilicon layer be doped in the deposition process (i.e., in-situ doping) or it can be deposited in its intrinsic (undoped) state and implanted with a blanket implant. Alternatively, for dual work function gates in high performance CMOS, two masks may be used to dope the polysilicon implant as N+ and P+ regions. Additionally, in some cases multiple layers of gate conductor materials are used, such as a layer of polysilicon covered by a layer of titanium silicide or tungsten silicide.

Figure 2:
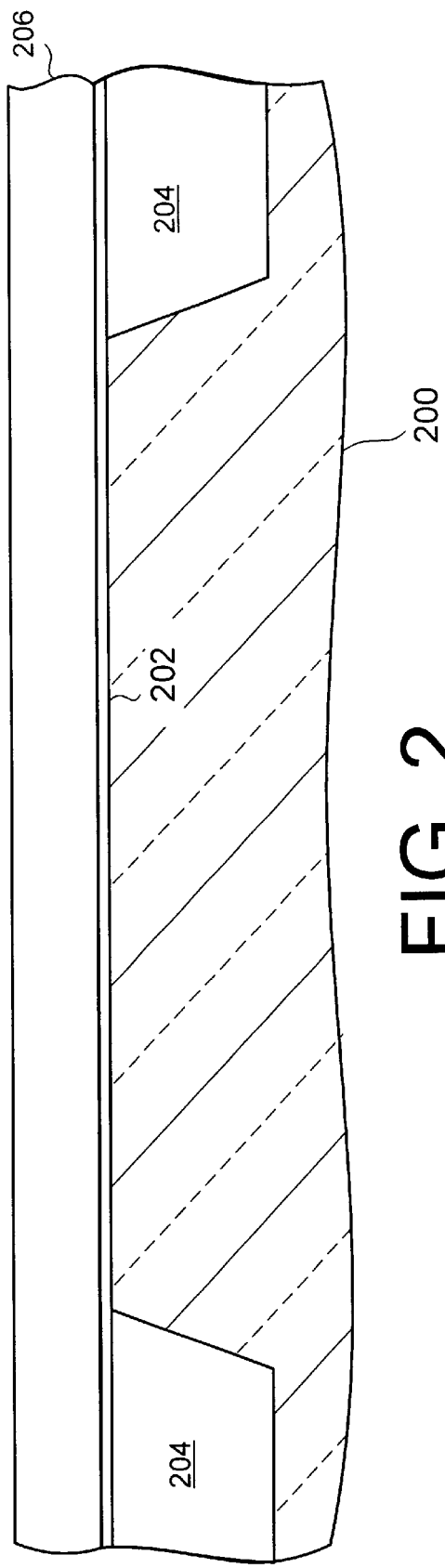
FIGS. 2–5 are cross-sectional side views of a wafer portion during various stages of fabrication in accordance with the preferred embodiment.

Turning now to FIG. 2, a wafer portion 200 is shown that will be used to illustrated the preferred embodiment of the present invention. The wafer portion 200 thus includes shallow trench isolation regions 204, a gate oxide layer 202, and a gate conductor layer 206.

Returning now to method 100, the next step 108 is to form a reflective coating on the gate conductor layer. As explained above, this reflective coating will be used to lower the amount of heat absorbed by the gate conductor layer during the PGILD process. By lowering the amount of heat absorbed by the gate conductor layer, the preferred embodiment improves the reliability of the fabrication process.

Any suitable reflective coating can be used in the preferred embodiment. Generally, the reflective coating should be selected to provide maximum reflection of the laser light used in the PGILD process. For example, a two layers of material, with each layer having a thickness of is $i\lambda/4n$, where i is an odd integer, where $\lambda$ is the wavelength of the PGILD laser and n is the refractive index of that layer, will serve as a suitable reflective coating. For example, a layer of oxide (having a relatively low refractive index) covered by a layer of nitride (having a relatively high refractive index) can be combined to form a reflective coating. In particular, a 50 nm layer of silicon oxide covered by a 38 nm layer of silicon nitride functions as a reflective coating when a 308 nm laser is used in the PGILD process. Of course, the actual materials and thicknesses used will vary from application to application.

As other examples of a reflective coatings, Ti, TiN, Ta and TaN could be used in place of the silicon nitride, and MgF, fluoro silicate glass could be used in place of the silicon dioxide. In an other example, a single layer of Al could be used as the reflective coating. Additionally, the thickness of the materials could be increased or decreased in increments of $\lambda/2n$, where $\lambda$ is the wavelength of the PGILD laser and n is the refractive index of the material which thickness is being changed.

The next step 110 in method 100 is to form an antireflective coating on the reflective coating. Anti-reflective coatings are commonly used to reduce variability of the photolithographic process used to pattern the gate stack. In particular, the anti-reflective coating reduces line width variation that can result from variations in the thickness of the photoresist used to pattern the gate stack.

There are a wide variety of suitable materials that can be used to form anti-reflective coating. For example, a suitable organic spinon coating ARC such as 60–90 nm of AR3 available from Shipley Inc. Of course, other materials and/or processes could be used, such as chemical vapor deposited silicon oxynitride.

Figure 3:
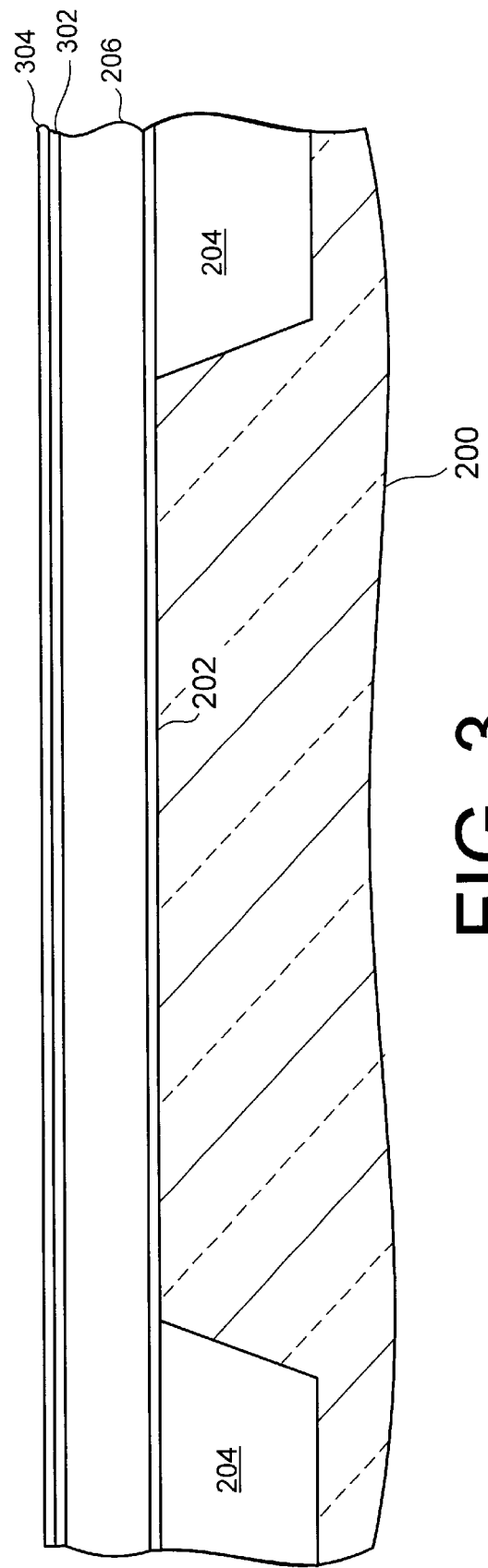

Turning now to FIG. 3, the wafer portion 200 is shown after the application of an reflective coating 302 and an anti-reflective coating 304. As discussed above, in the preferred the reflective coating 302 comprises a suitable thickness silicon oxide layer covered by a suitable thickness silicon nitride layer, although in FIG. 1 the reflective coating 302 is shown as one layer for simplicity. Again, the anti-reflective coating 304 preferably comprises an organic ARC.

Returning to the method 100, the next step 112 is to pattern the gate stack. This can be done with any suitable process, but is preferably done by depositing, selectively exposing, and developing photoresist, as is well known in the art. The photoresist is then used as a mask during while the gate stack is selectively etched. This removes the gate conductor and gate dielectric except where a gate is to be formed.

With the gate stack pattered, the next step 114 is to remove the anti-reflective coating from the gate, while leaving the reflective coating on the gate. The preferred process used to selectively remove the anti-reflective coating from the gate would depend upon the materials used for the anti-reflective coating and the underlying reflective coating. For example, when the anti-reflective coating comprises an organic ARC, and the reflective coating comprises silicon oxide\silicon nitride, an oxygen reactive ion etch or plasma etch can be used to remove the anti-reflective coating while leaving the reflective coating.

Figure 4:
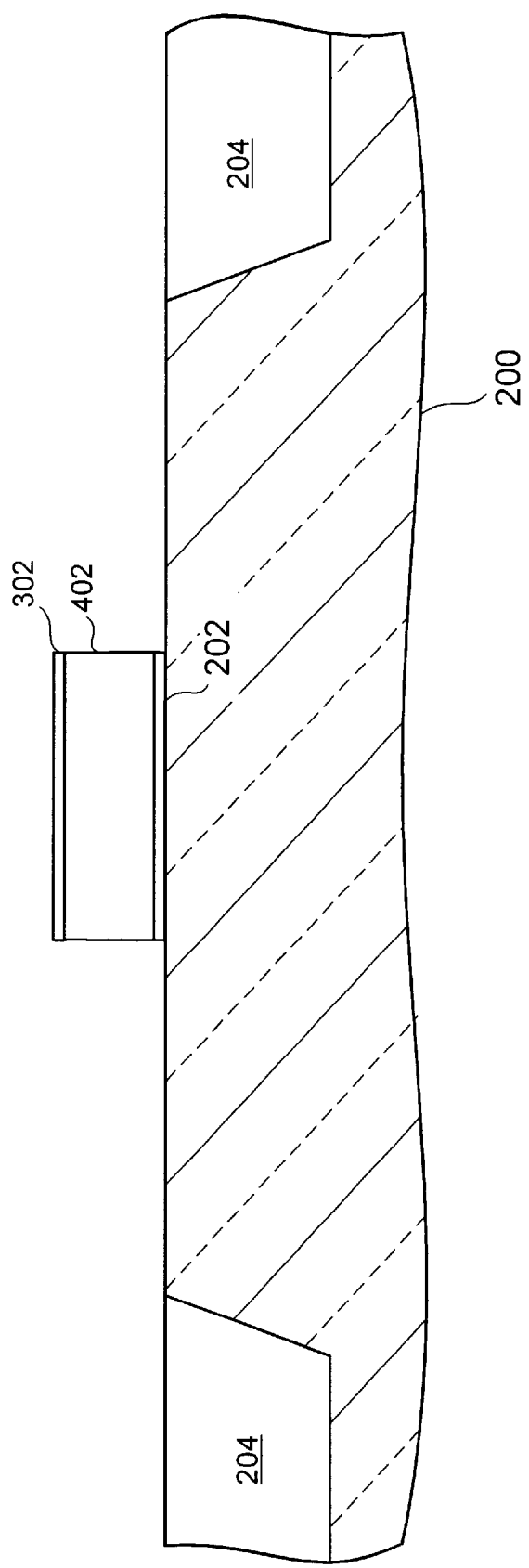

Turning now to FIG. 4, the wafer portion 200 is illustrated after the gate conductor 206 and gate dielectric 202 have been patterned to define a gate 402 in accordance with the preferred embodiment. After the gate was patterned, the anti-reflective coating 304 was removed while leaving behind reflective coating 302 on the top of gate 402. With the gate 402 covered with a reflective coating, damage to the gate during the PGILD process will be minimized.

Returning to the method 100, the next step 116 is to form sidewall spacers on the gate stack. This can be done using conventional CMOS processing methods. For example, thermal oxide can be grown to form a sidewall oxide. As another example, a conformal deposition of oxide followed by a directional etch can be used to form sidewall spacers. If a nitride spacer is desired, the reflective coating In some cases it may be desirable to perform a light source/drain implants before the formation of the gate sidewall spacer to create the desired drain doping profile and correct gate/drain overall.

Returning to the method 100, the next step 118, is to implant to create amorphous region in the surface of the wafer. As described above, this amorphous region facilitates the use of the PGILD implant process to create source and drain regions. Typically, this can be done with a blanket implant of silicon or germanium, with implant densities between at 1E14 and 1E15 atoms/cm². The implant energy should be selected to form a shallow implant near the surface of the wafer.

The next step 120 is to form the source/drain regions using the Projection Gas-Immersion Laser Doping (PGILD) process. The PGILD process eliminates normal photoresist processing during much of impurity doping. This allows for the elimination of multiple process steps and the associated equipment. In particular, PGILD allows dopants to be selectively incorporated into a substrate without photoresist masking. Of course, the preferred embodiment could be applied to other laser induced doping methods that may exist now or be developed in the future.

PGILD uses a high-intensity laser beam to selectively expose a wafer in an ambient containing the dopant atoms in gas phase above the wafer. The selective exposure exposes those portions of the wafer where impurities are desired. In the exposed portions of the wafer, light is absorbed by the silicon, heating the surface and allowing the dopant atoms to diffuse into the exposed portions of the wafer.

In step 118, the PGILD process is used to create the source/drain doped regions in the substrate. The parameters of the PGILD process used (e.g., dopants, ambient, laser energy levels) are preferably determined by specific device needs using principles known in the art.

The heat absorbed by the gate can be tailored by the choice of reflective film thickness and materials. The source/drain regions can therefore be heated somewhat independently of the gate regions. This tailoring process will permit sufficient dopant activation in the gate polysilicon while protecting against thermal degradation of the gate stack. Furthermore, mask layers can be employed as described by PGILD literature to allow N+ and P+ regions to be heated by the laser independently of one another.

The PGILD laser causes areas of amorphous silicon to recrystalize, making it doped single crystal silicon. In some cases, it may be desirable to use additional exposures to fully recrystalize all areas of the wafer.

Figure 5:
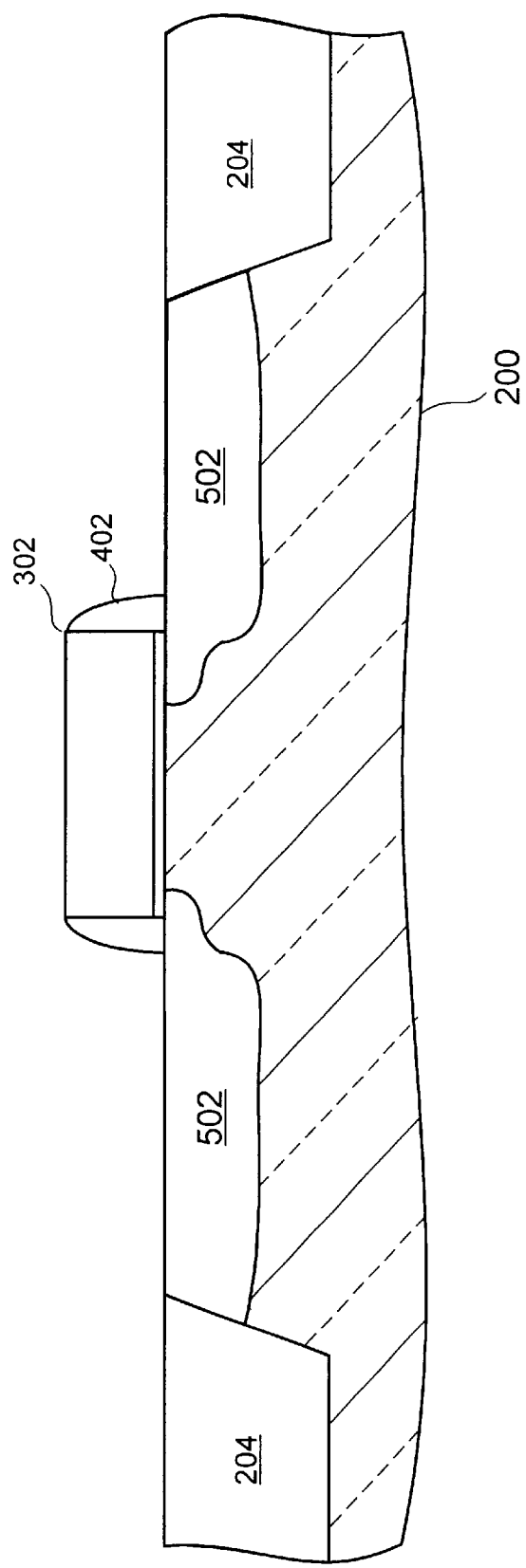

Turning now to FIG. 5, the wafer portion 200 is illustrated after formation of the source/drain doped regions 502. The source/drain regions 502 offer the advantage of providing the ability to form shallow abrupt junctions where the junction depth is determined by the depth of the amorphous region.

With the source/drain regions formed, the next step 122 is to complete the devices. As is known in the art, this typically involves the formation of needed device contacts, interconnect wiring and packaging. This can also involve the removal of the reflective coating using any suitable process, such as reactive ion etching.

Thus, the preferred embodiment provides an improved method for fabricating transistors that offers the advantages of the PGILD process (e.g., reduced process complexity, relatively abrupt p-n junctions of varying depth, reducing required additional anneals, etc.), while reducing the disadvantages (e.g., degradation and loss of continuity due to laser-induced heat).

There are several variations on the preferred embodiment that may be desirable in different applications. For example, a first variation applies the reflective coating after the gate has been patterned. This has the advantage of not requiring the gate to be predoped, but has the disadvantage of not self aligning the reflective coating to the gate.

While the invention has been particularly shown and described with reference to an exemplary embodiment using hybrid resist to form a field effect transistor with raised source and drain regions, those skilled in the art will recognize that the preferred embodiment can be applied to the formation of other devices using the PGILD process. For example, the method can be used to form other types of transistors, such as bipolar transistors. It will also be understood that the spirit of the invention is applicable to other semiconductor technologies (e.g., BiCMOS, bipolar, silicon on insulator (SOI), silicon germanium (SiGe).

What is claimed is:

1. A method for implanting on a substrate, the method comprising the steps of:

a) forming a reflective layer on a portion of the substrate;

b) forming an anti-reflective coating on the reflecting layer;

c) patterning the substrate, said patterning removing a portion of the reflecting layer, a portion of the anti-reflecting coating, and a portion of the substrate such that a portion of the substrate is not covered by the anti-reflective coating and the reflective layer;

d) removing a remaining portion of the anti-reflective coating, said removing exposing a remaining portion of the reflective layer on a remaining portion of the substrate;

e) forming an implant using laser induced doping in the portion of the substrate not covered by the reflective layer.

2. The method of claim 1 wherein reflective coating comprises a layer of silicon nitride and a layer of silicon dioxide having relative thicknesses selected to be reflective to light of a predetermined wavelength.

3. The method of claim 1 wherein reflective coating comprises a 30 nm thick layer of silicon nitride and 80 nm thick layer of silicon dioxide.

4. The method of claim 1 wherein the substrate comprises a gate stack layer on a semiconductor wafer, and wherein the step of patterning the substrate comprises patterning the gate stack layer to form at least one gate.

5. The method of claim 4 wherein the gate stack layer comprises polysilicon.

6. The method of claim 4 wherein the step patterning the gate stack layer comprises:

a) depositing and patterning resist; and b) patterning the gate stack layer using the patterned resist.

7. The method of claim 6 wherein the anti-reflective coating comprises an organic spin-on coating.

8. The method of claim 1 wherein the laser doping comprises a p-type projection gas laser immersion doping in an $BF_3$ including ambient.

9. The method of claim 1 wherein the laser doping comprises a n-type projection gas laser immersion doping in an $AsF_5$ including ambient.

10. A method for forming a transistor, the method comprising the steps of:

a) forming a gate stack layer on a substrate;

b) forming a reflective coating on the gate stack layer, and forming a anti-reflective coating on the reflective coating;

c) patterning the gate stack layer; and d) forming source/drain implants in the substrate using by exposing the substrate to a laser through an implant-including gas.

11. The method of claim 10 wherein reflective coating comprises a layer of silicon nitride and a layer of silicon dioxide having relative thicknesses selected to be reflective to light of a predetermined wavelength.

12. The method of claim 11 wherein reflective coating comprises a 30 nm thick layer of silicon nitride and 80 nm thick layer of silicon dioxide.

13. The method of claim 10 wherein the gate stack layer comprises polysilicon.

14. The method of claim 10 wherein the anti-reflective coating comprises an organic spin-on coating.

15. The method of claim 11 further comprising the of forming sidewall spacers on the sidewalls of the patterned gate stack layer.

16. The method of claim 11 wherein ambient comprises an $AsF_5$ ambient.

17. The method of claim 11 wherein ambient comprises an $BF_3$ ambient.

18. A method for forming a transistor on a substrate, the method comprising the steps of:

a) forming an gate stack layer on the substrate;

b) forming an reflective coating on the gate stack layer;

c) forming an anti-reflective coating on the reflective coating;

d) patterning the gate stack layer to define at least one transistor gate;

e) removing the anti-reflective coating from the gate stack layer; and f) forming source/drain implants using a projection gas immersion laser doping.

* * * * *